(12) United States Patent
Huster

(10) Patent No.: US 6,225,229 B1
(45) Date of Patent: May 1, 2001

(54) REMOVABLE PHOTORESIST SPACERS IN CMOS TRANSISTOR FABRICATION

(75) Inventor: Carl R. Huster, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/317,157

(22) Filed: May 24, 1999

(51) Int. Cl.$^7$ .................................................. H01L 21/312
(52) U.S. Cl. ..................... 438/696; 438/947; 438/303; 438/595
(58) Field of Search ................................ 438/424, 435, 438/701, 978, 296, 210, 217, 384, 238, 382, 303, 595, 696

(56) References Cited

U.S. PATENT DOCUMENTS

| | | | |
|---|---|---|---|
| 4,631,113 | * 12/1986 | Donald | 156/659.1 |
| 5,651,857 | * 7/1997 | Cronin et al. | 156/644.1 |
| 5,759,885 | * 6/1998 | Son | 438/230 |
| 5,801,083 | * 9/1998 | Yu et al. | 438/424 |
| 5,872,030 | * 2/1999 | Huang | 438/210 |
| 5,936,278 | * 8/1999 | Hu et al. | 257/336 |

* cited by examiner

*Primary Examiner*—Mary Wilczewski
*Assistant Examiner*—David J Goodwin

(57) ABSTRACT

Removable photoresist sidewall spacers are formed on side surfaces of device features, such as gate electrodes, enabling simplifying CMOS methodology by reducing the number of critical masks and processing steps. Embodiments included angular exposure of a photoresist layer using the device feature to shadow the photoresist on the side surface, thereby preventing exposure such that the unexposed photoresist portion is not removed during subsequent development. Embodiments of the present invention also include forming removable, photoresist sidewall spacers on the side surfaces of the gates of NMOS and PMOS transistors, forming moderately or heavily doped source/drain implants, activation annealing to form moderately or heavily doped source/drain regions, ion implanting shallow source/drain extensions and halo regions and activating the shallow extensions and halo regions.

16 Claims, 5 Drawing Sheets

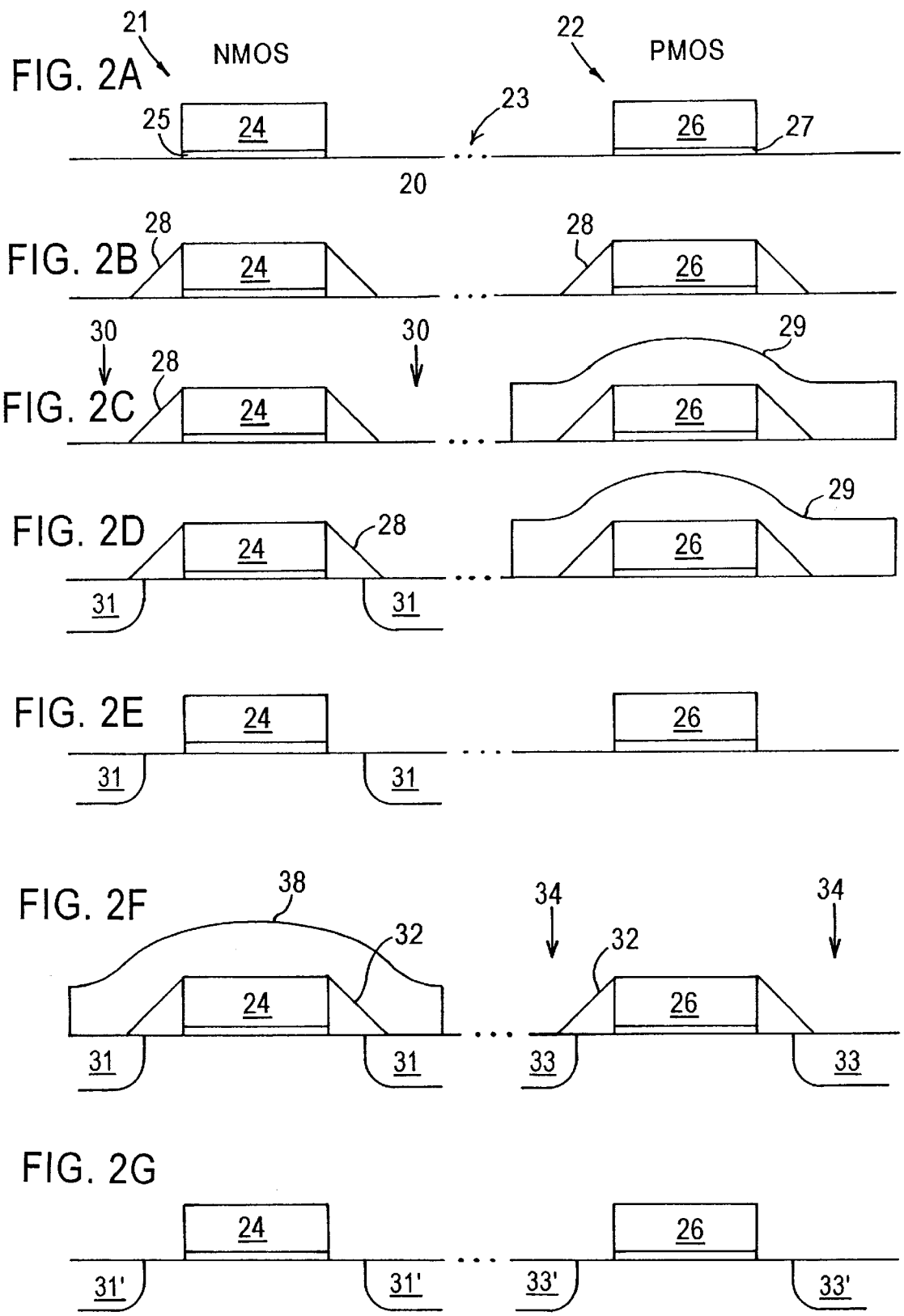

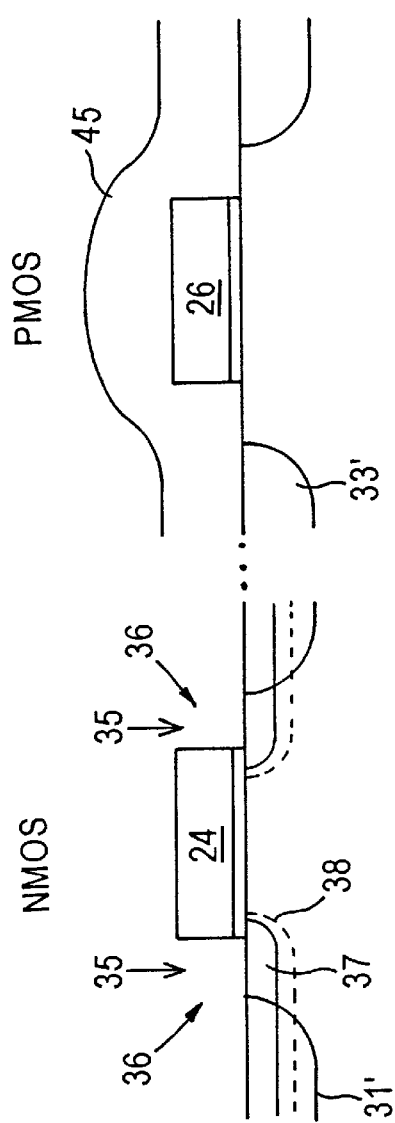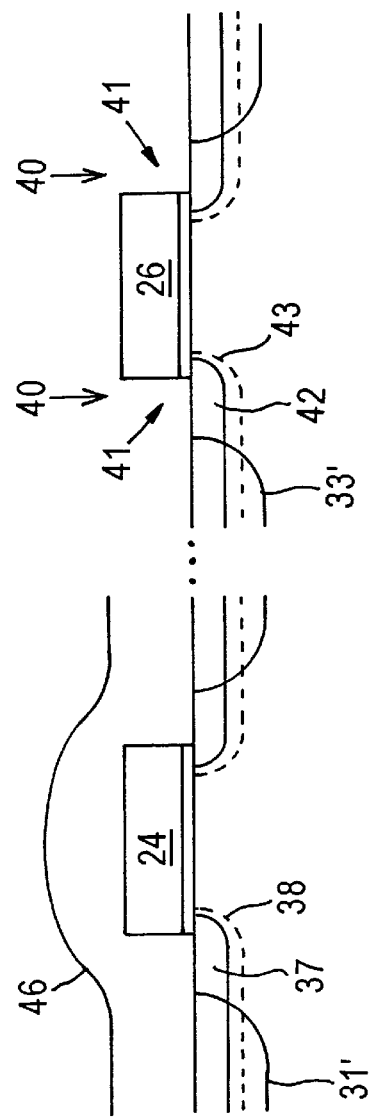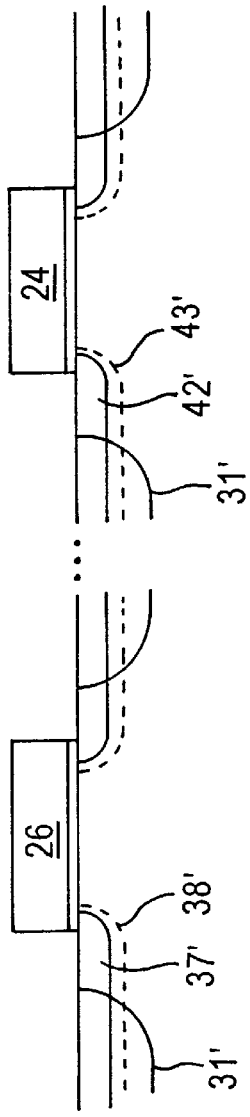

REMOVABLE PHOTORESIST SPACERS IN CMOS TRANSISTOR FABRICATION

TECHNICAL FIELD

The present invention relates to a method of manufacturing semiconductor devices. The present invention has particular applicability in manufacturing complementary metal oxide semiconductor (CMOS)-type transistor devices and integrated circuits comprising such devices.

BACKGROUND ART

The escalating requirements for high density and performance associated with ultra large scale (ULSI) semiconductor devices require design features of 0.18 µm and below, increased transistor and circuit speeds, high reliability, and increased manufacturing throughput for economic competitiveness. The reduction of design features to 0.18 µm and below challenges the limitations of conventional semiconductor manufacturing techniques.

As feature sizes of metal oxide semiconductor (MOS) and CMOS devices plunge into the deep sub-micron range, so called "short channel" effects have arisen which tend to limit device performance. For N-channel MOS transistors, the major limitation encountered is caused by hot-electron-induced instabilities, due to high electrical fields between the source and drain, particularly near the drain, with an attendant injection of charge carriers into the gate or semiconductor substrate. Injection of hot carriers into the gate can cause gate oxide charging and threshold voltage instabilities which accumulate over time and greatly degrade device performance.

For P-channel MOS transistors of short-channel type, the major limitation on performance arises from "punch-through" effects which occur with relatively deep junctions. In such instances, there is a wider sub-surface depletion effect and it is easier for the field lines to go from the drain to the source, resulting in the above-mentioned "punch-through" current problems and device shorting. To minimize this effect, relatively shallow junctions are employed in forming p-channel MOS transistors.

A conventional approach to hot carrier instability problems of MOS and CMOS devices comprises forming lightly- or moderately-doped source/drain extensions just under the gate region, while the moderately or heavily-doped source/drain regions are laterally displaced from the gate by at least one dielectric sidewall spacer on the side surfaces of the gate. Such structures are particularly advantageous because they do not have problems with large lateral or vertical diffusion.

Several processing sequences or schemes have been developed for the manufacture of lightly or moderately-doped source/drain extension-type MOS and CMOS transistors for use in high-density integration applications, with a primary goal of simplifying the manufacturing process by reducing and/or minimizing the requisite number of critical marks and processing steps. See, for example, copending U.S. patent applications Ser. No. 09/277,161 filed on Mar. 26, 1999, and Ser. No. 60/149,420 filed on Aug. 18, 1999, wherein disposable sidewall spacers are employed to significantly reduce the number of masks and process steps in CMOS transistor fabrication. Such disposal sidewall spacer techniques involve reversal of the conventional technique by initially forming moderately or heavily doped source/drain implants, removing the sidewall spacers, and then forming the lightly or moderately doped source/drain extension implants.

There, however, exists a need for a method of manufacturing semiconductor devices with a reduced number of critical masks employing disposable sidewall spacers which can be formed and removed in an efficient, cost effective manner without adversely impacting device integrity. There exists a particular need for such methodology which can be easily implemented into existing processing.

DISCLOSURE OF THE INVENTION

An advantage of the present invention is a method of forming disposal sidewall spacers on a device feature, such as a gate electrode structure, in a cost effective, efficient manner.

Another advantage of the present invention is a method of forming sidewall spacers on a gate electrode structure which can be removed in a cost effective, efficient manner without adversely impacting device integrity.

A further advantage of the present invention is a method of forming CMOS transistors employing a minimal number of critical masks and processing steps, thereby reducing manufacturing cost and increasing production throughput while improving device reliability and integrity.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method comprising forming a feature, having a first and second side surfaces, over a substrate; depositing a layer of positive photoresist material on the feature covering the first and second side surfaces; irradiating the photoresist layer at an angle with respect to the substrate such that a portion of the photoresist material on the first side surface is shadowed from irradiation by the feature, thereby preventing irradiation exposure of the portion of photoresist material on the first side surface; and removing the irradiated positive photoresist material with a developer leaving the non-irradiated portion of photoresist material on the first side surface as a sidewall spacer.

Another aspect of the present invention is a method comprising the steps: (a) forming first and second gate electrode structures, each comprising an underlying gate dielectric layer and having first and second side surfaces, on electrically isolated first and second opposite conductivity type regions, respectfully, of a substrate; (b) forming photoresist sidewall spacers on the first and second side surfaces of each gate electrode structure; (c) forming a first photoresist mask on the second region over the second gate electrode structure and photoresist sidewall spacers thereon; (d) ion implanting impurities of the first conductivity type, using the first gate electrode structure and photoresist sidewall spacers thereon as a mask, to form first moderately or heavily doped source/drain implants; (e) removing the first photoresist mask and photoresist sidewall spacers from the first and second side surfaces of each gate electrode structure; (f) forming photoresist sidewall spacers on the first and second side surfaces of each gate electrode structure; (g) forming a second photoresist mask on the first region over the first gate electrode structure; (h) ion implanting impurities of a second conductivity type opposite the first conductivity type, using the second gate electrode structure and photoresist sidewall spacers thereon as a mask, to form second moderately or heavily doped source/drain implants; (i) removing the second photoresist mask and photoresist sidewall spacers from the first and second side surfaces of each gate electrode structure; (j) activation annealing to form first and second moderately or heavily doped source/drain regions; (k) forming a third photoresist mask on the second region over the second gate electrode structure; (l) ion implanting impurities of the first conductivity type, using the first gate electrode structure as a mask, to implant shallow source/drain extensions; (m) ion implementing impurities of the second conductivity type into the first region to form a first halo implant; (n) removing the third photoresist mask; (o) forming a fourth photoresist mask on the first region over the first gate electrode structure; (p) ion implanting impurities of the second conductivity type using the second gate electrode structure as a mask to implant second shallow source/drain extensions; (q) ion implanting impurities of the first conductivity type in the second region to form a second halo implant; (r) removing the fourth photoresist mask; and (s) activation annealing to form first and second shallow source/drain extension regions and first and second halo regions.

Embodiments of the present invention comprise forming CMOS transistors by depositing a layer of photoresist material covering PMOS and NMOS gate electrode structures, each having first and second side surfaces. An initial irradiation is then performed at an angle inclined toward the first side surfaces, e.g., an angle of greater than 0° and less than 90° with respect to the substrate, at a dosage less than that sufficient to render previously unexposed photoresist material soluble in a developer, e.g., an aqueous base such as ammonium or an alkali metal hydroxide. The gate electrode structures shadow the portion of photoresist material on the second side surfaces preventing their exposure to the first dosage of irradiation. A second angular irradiation is then conducted inclined toward the second side surfaces of the gate electrode structures, e.g., at an angle of greater than 90° and less than 180°, at a second irradiation dosage also less than that which would by itself render previously unexposed photoresist material soluble in the developer, such that the gate electrode structures shadow the portion of photoresist material on the first side surfaces preventing their exposure to the second dosage. Thus, the portions of photoresist material on the first and second side surfaces receive either the first dosage or the second dosage, but not both the first and second dosages which are necessary to render the photoresist material in the developer. Subsequently, the developer is applied to remove the portions of the photoresist material exposed to both the first and second dosages, leaving the portions of photoresist material on the first and second side surfaces of the gate electrode structures which have received either the first dosage or second dosage as removable sidewall spacers since they are insoluble in the developer.

Additional advantages and aspects of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF DRAWINGS

In FIGS. 1A–1E, similar features are denoted by similar reference numerals.

FIGS. 2A–2J schematically illustrate sequential phases of a method in accordance with an embodiment of the present invention. In FIGS. 2A–2H, similar features are denoted by similar reference numerals.

DESCRIPTION OF THE INVENTION

The present invention provides a simplified, cost effective and efficient technique enabling the formation of readily disposable photoresist sidewall spacers. The removable photoresist sidewall spacers formed in accordance with the present invention can advantageously be removed in a simplified conventional manner without adversely impacting the device structure and performance. Thus, the present invention advantageously enables manufacture of CMOS devices with a reduced number of masks and processing steps, thereby reducing overall production cost, increasing manufacturing throughput and improving device reliability.

A removable photoresist sidewall spacer formed in accordance with the present invention comprises a positive photoresist material formed on the side surfaces of a device feature, such as a gate electrode structure comprising a conductive layer on an underlying gate dielectric layer. Positive photoresist materials are conventionally employed during manufacturing semiconductor devices, as in photolithographic techniques. A conventional positive photoresist material typically contains a film forming compound, e.g., a novolac resin, a photoactive compound, a solvent and a dye. Positive photoresist materials are typically deposited and then imagewise exposed to form a pattern. The exposed portions are rendered soluble in a developer, e.g., an aqueous base. Such positive photoresist materials, methods of deposition, methods of exposure and developers, are well known in the art and, hence, not set forth herein with particular detail.

In accordance with embodiments of the present invention, a positive photoresist layer is deposited over a device feature, such as a gate electrode structure, and irradiated at an angle with respect to the substrate such that the gate electrode structure itself shadows a portion of the photoresist layer on a side surface, thereby preventing exposure thereof. The remaining exposed portions of the photoresist layer are rendered soluble by exposure to irradiation and removed with a conventional developer, e.g., aqueous ammonium or alkali metal hydroxides. This aspect of the present invention is schematically in FIGS. 1A–1C.

Figure 1A:
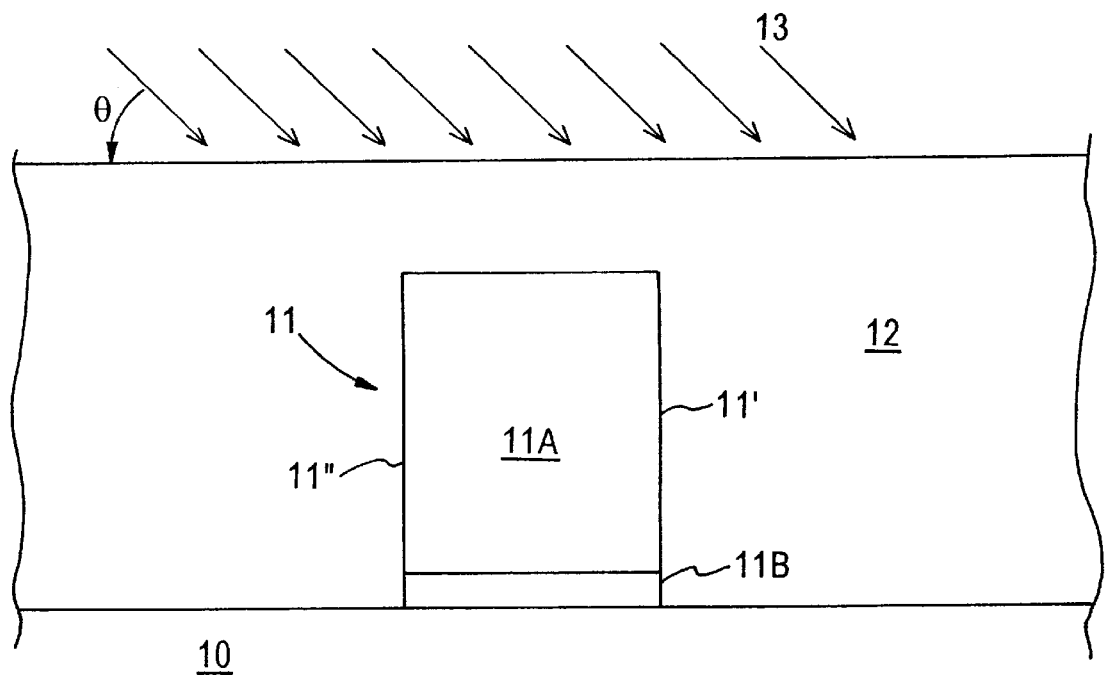
FIGS. 1A–1C illustrate sequential steps in forming a single removable sidewall spacer in accordance with embodiments of the present invention.
Figure 1B:
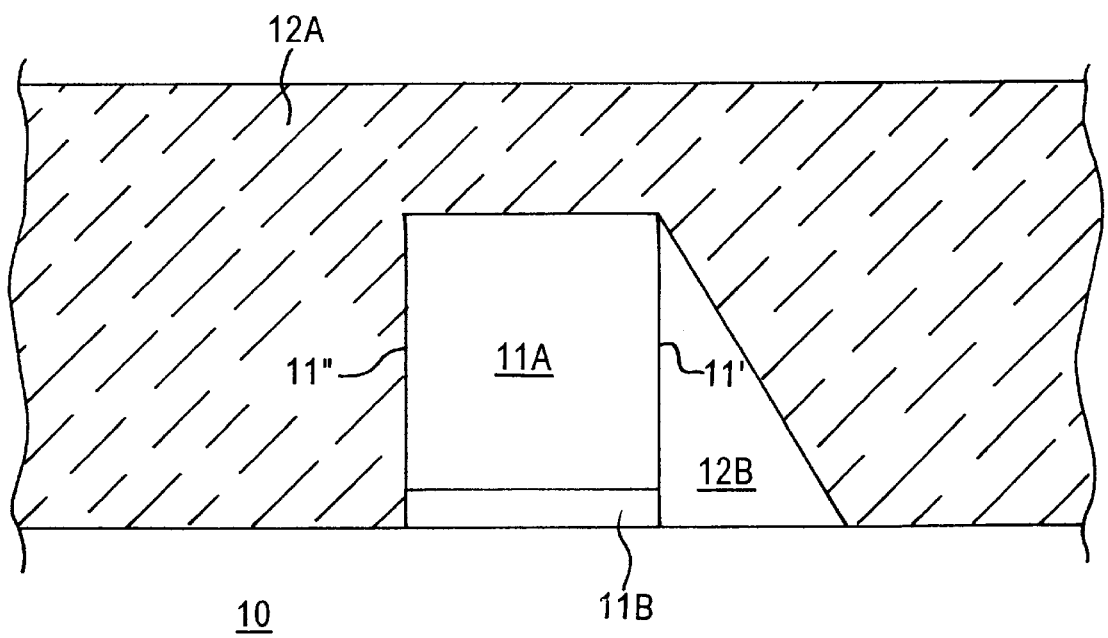
Figure 1C:
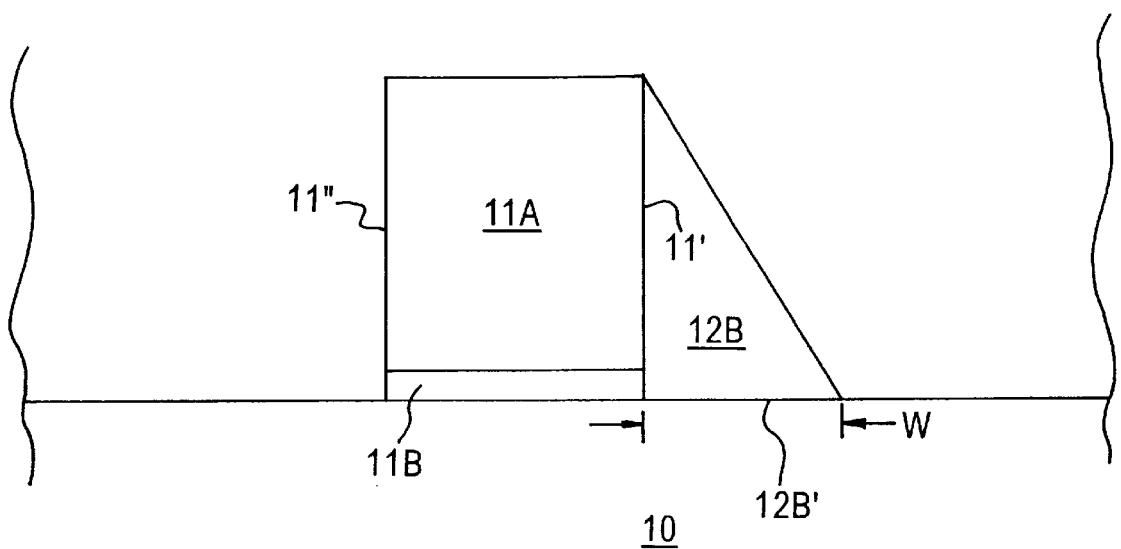

Adverting to FIG. 1A, a device feature 11, e.g., a gate electrode, is formed on semiconductor substrate 10. Gate electrode 11 comprises conductive layer 11A on gate dielectric layer 11B. A layer of conventional positive photoresist material 12 is deposited covering gate electrode structure 11. Light or irradiation exposure is then conducted, as indicated by arrows 13, at an angle θ with respect to the substrate, exposing photoresist layer 12 but shadowing a portion of photoresist layer 12 adjacent first side surface 11' of gate electrode structure 11. Consequently, as shown in FIG. 1B, the shadowed portion of photoresist layer 12 adjacent first side surface 11' of gate electrode structure 11 is not exposed to irradiation 13 and, hence, is not rendered soluble in an aqueous base developer. The portion of photoresist layer 12 adjacent first side surface 11' of gate electrode structure 11 is designated by reference numeral 12B while the portion of photoresist layer 12 rendered soluble by irradiation is designated by reference numeral 12A. The exposed portion of photoresist layer 12A is then removed with a conventional aqueous base developer, leaving photoresist sidewall spacer 12B on the first side surface 11' of gate electrode structure 11, as illustrated in FIG. 1C. Photoresist sidewall spacers formed in accordance with embodiments of the present invention can be subsequently removed in a conventional manner, as with an oxygen-containing plasma.

Adverting to FIG. 1A, the irradiation angle θ can be determined in a particular situation depending upon the height of gate electrode 11, given the objective of the present invention to utilize the gate electrode structure 11 to shadow the photoresist material 12 adjacent a side surface thereof. For example, the irradiation angle θ can be greater than 0° and less than 90°.

Adverting to FIG. 1C, the geometric configuration of disposable photoresist sidewall spacer 12B formed in accordance with the present invention manifestly depends upon the height of the gate electrode structure 11 and implantation angle θ. The photoresist sidewall spacer 12B is typically substantially triangular in shape having a base 12B' with a width W of about 200 Å to about 800 Å, depending upon the particular structure.

Figure 1D:
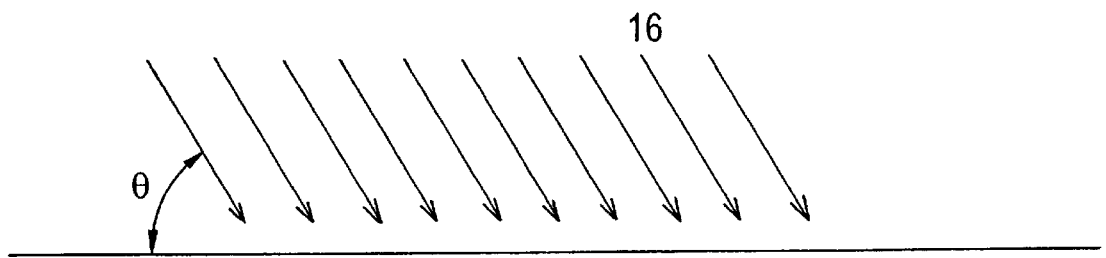
FIGS. 1D and 1E illustrate the formation of two sidewall spacers on a gate structure in accordance with an embodiment of the present invention.
Figure 1D:
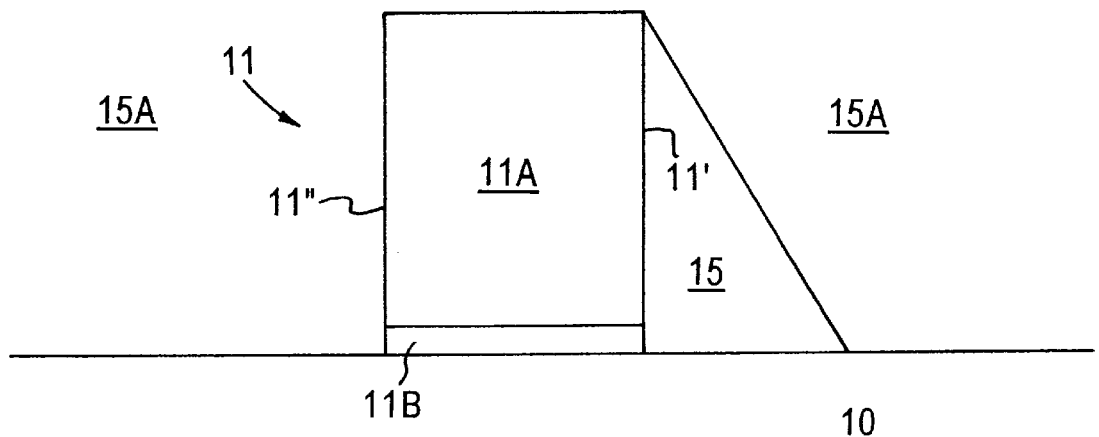
Figure 1E:
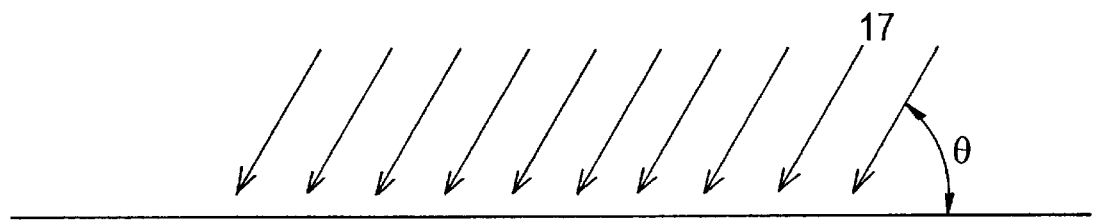
Figure 1E:
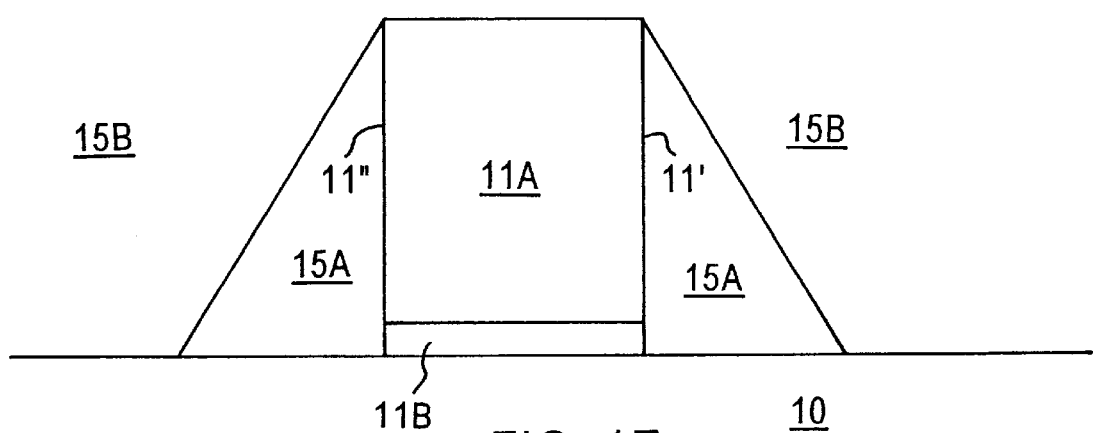

FIGS. 1D and 1E schematically illustrate the formation of dual removable photoresist sidewall spacers in accordance with an embodiment of the present invention. Adverting to FIG. 1D, the layer of photoresist material is initially irradiated at a first dosage, indicated by arrows 16 at an appropriate angle θ, such that the photoresist material on the first side surface 11' of gate electrode structure 11 is shadowed. Thus, in depositing a photoresist layer and irradiating at the first dosage 16, the entire photoresist layer becomes exposed to the first dosage and is designated by reference numeral 5A, except for the portion of photoresist material adjacent first side surface 11' designated by reference numeral 15. The first dosage is less than that which would render previously unexposed photoresist material soluble in the developer, e.g., an aqueous base. For example, the first dosage 16 can be about 50% of that necessary to render the photoresist layer soluble in a conventional aqueous base developer.

The photoresist layer is then exposed to a second dosage 17, at an angle θ, which second dosage is, in itself, insufficient to render previously unexposed photoresist material soluble in the developer. However, portions of the photoresist layer receiving both the first dosage 16 and the second dosage 17 are rendered soluble in the developer and designated by reference numeral 15B. During the second dosage 17, which can also be about 50% of that necessary to render previously exposed photoresist material soluble in the developer, the portions of photoresist material previously exposed to the first dosage 16 adjacent second side surface 11", i.e., portion 15A, is shadowed by the gate electrode structure. Accordingly, photoresist sidewall spacers 15A are formed on first and second side surfaces 11', 11", respectively of the gate electrode structure. Each such photoresist sidewall spacer 15A received a partial dosage of irradiation insufficient to render the photoresist material soluble in the developer.

The present invention employing removable photoresist sidewall spacers can be advantageously applied to manufacturing CMOS devices. Embodiments of the present invention comprise forming the removable photoresist sidewall spacers, as illustrated in FIGS. 1D and 1E, on NMOS and PMOS gate electrode structures in an N- and P- electrically isolated regions of a semiconductor substrate. One region is masked while ion implantation is conducted in the unmasked area, employing the gate electrode and disposable sidewall spacers as an ion implantation mask, to form moderately or heavily doped source/drain implants. The photoresist sidewall spacers are then removed and ion implantation is again conducted to form lightly or moderately doped source/drain extension implants. The first mask is removed and a second mask is then formed over the previously unmasked area and the sequence repeated. Advantageously, the NMOS implantations can be initially conducted and activation annealed at a first temperature and the PMOS implantations can be conducted and activation annealed at a second temperature greater than the first temperature, thereby minimizing difflusion of the N-type impurities and reducing junction depth.

An embodiment of a method of forming CMOS transistors in accordance with the present invention is schematically illustrated in FIGS. 2A–2J, wherein similar features are denoted by similar reference numerals. A portion of a semiconductor substrate 20 is schematically illustrated in FIG. 2A which comprises a first region 21 for an NMOS transistor and a second region 22 for a PMOS transistor separated by the field dielectric region 23. Field dielectric region 23 can comprise any conventional isolation means, such as a shallow trench isolation or formed by local oxidation of silicon (LOCOS). Semiconductor substrate 20 is typically monocrystalline silicon. As employed throughout the present disclosure and claims, the term "substrate" includes a semiconductor substrate per se or epitaxial semiconductor layer formed a semiconductor substrate.

The first transistor formed in the first region 21 (NMOS) region comprises a gate electrode structure containing a gate electrode 24 and underlying gate dielectric layer 25. The gate electrode structure formed in the second PMOS region 22 comprises a gate electrode 26 and underlying gate dielectric layer 27.

A layer of positive photoresist material is deposited. Two angular irradiation steps are then performed, such as illustrated in FIGS. 1D and 1E, to render the photoresist material soluble except for the portions on the side surfaces of the gate electrode structures. The fully exposed photoresist material is then removed employing an aqueous base developer, leaving removable photoresist sidewall spacers 28 on the side surfaces of the NMOS and PMOS gate electrode structures, as shown in FIG. 2B.

Adverting to FIG. 2C, a first photoresist mask 29 is then formed on the PMOS region, i.e., portions of the main surface of substrate 20 which are subsequently ion implanted with P-type impurities. N-type dopant impurities, such as phosphorous or arsenic, are then ion implanted into substrate 20, as indicated by arrows 30, typically at a dosage of about $5 \times 10^{14}$ to about $5 \times 10^{15}$ atoms/cm$^2$ at an energy of about 40 to about 60 KeV to form N-type moderate or heavily doped source/drain implants 31 as shown in FIG. 2D.

Adverting to FIG. 2E, the first mask 29 is removed and photoresist sidewall spacers 28 are then removed or stripped, as with an oxygen-containing plasma. A second set of removable photoresist sidewall spacers 32 is formed on the side surfaces of the gate electrode structures in the NMOS and PMOS regions, as illustrated in FIG. 2F, in a manner similar to forming first sidewall spacers 28. A second photoresist mask 38 is then formed on the NMOS regions. Ion implantation of P-type impurities, such as boron, is then conducted, as illustrated by arrows 34 typically at a dosage of about $5 \times 10^{14}$ to about $5 \times 10^{15}$ atoms/cm$^2$ and an energy of about 20 to about 40 KeV, to form P-moderately or heavily doped source/drain implants 33.

Adverting to FIG. 2G, second mask 38 is removed and photoresist sidewall spacers 32 are removed from both gate electrode structures. Activation annealing is then conducted, as at a temperature of about 1,000° C. to about 1,050° C. for about 1 to about 30 seconds, thereby activating both first and second moderately or heavily doped source/drain implants 31, 33, to form first and second moderately or heavily doped source/drain regions 31', 33', as shown in FIG. 2G.

Advantageously, in accordance with the methodology of the present invention, the shallow source/drain regions and halo regions are formed subsequent to activation annealing the source/drain regions for both the NMOS and PMOS transistors. Adverting to FIG. 2H, a third photoresist mask 45 is formed over the PMOS region and N-type impurities are ion implanted, employing the NMOS gate structure as a mask, as indicated by arrows 35, typically phosphorous or arsenic, as at a dosage of about $1 \times 10^{14}$ to about $1 \times 10^{15}$ atoms/cm$^2$ and at an energy of about 2 to about 10 KeV, to implant N-type shallow source/drain extensions 37. As in conventional CMOS processing, such impurities for the shallow extensions are implanted at a lower dosage and a substantially lower energy than employed for implanting the moderately or heavily doped implants. In addition, P-type impurities are introduced, as indicated by arrows 36, to form halo implants 38, typically at a dosage of about $1 \times 10^{13}$ to about $4 \times 10^3$ atoms/cm$^2$ and an energy of about 5 to about 40 KeV.

Third photoresist mask 45 is then removed, and fourth photoresist mask 46 then formed over the NMOS region. Ion implantation is then conducted, such as boron-containing ions, as illustrated by arrows 40, typically at a dosage of about $1 \times 10^{14}$ to about $1 \times 10^{15}$ atoms/cm$^2$ and at an energy of about 2 to about 10 KeV, to implant shallow source/drain extensions 42. As in conventional CMOS processing, such channel extensions are implanted at a lower dosage and energy than employed for implanting the moderately or heavily doped implants. In addition, N-type impurities are implanted, as indicated by arrows 41, to form halo implants 43, typically at a dosage of about $1 \times 10^{14}$ to about $5 \times 10^{14}$ at/cm$^2$ and an energy of about 2 to about 10 KeV.

Adverting to FIG. 2J, the fourth photoresist mask 46 is removed followed by a second activation annealing, typically at a temperature of about 975° C. to about 1,050° C. for about 1 to about 30 seconds, to activate the first and second shallow source/drain extensions 37, 42 and first and second halo implants 38, 43, to form first and second shallow source/drain extensions 37', 42', and first and second halo regions 38', 43'.

It should be recognized that the distance W that the base 12B' (FIG. 1C) of the triangular shaped removable positive photoresist sidewall spacer formed in embodiments of the present invention can be optimized in a particular situation. The distance W (FIG. 1C) to which the removable positive photoresist sidewall spacers extend on the main surface of the substrate determine placement of the implanted lightly or moderately doped source/drain extensions with respect to the approximate edges of the gate electrode structures. Since the location of such source/drain regions and associated junctions significantly impact the electrical characteristics of the transistor, the width W can be tailored to optimize performance of the resulting device.

Embodiments of the present invention also include forming a relatively thin inner tapered sidewall spacer having a width of about 75 Å to about 300 Å directly on the side surfaces of the gate electrode structures prior to forming removable photoresist sidewall spacers thereon. Such relatively thin dielectric sidewall spacers can be formed of an oxide, a nitride or an oxynitride, e.g., silicon oxide, silicon nitride or silicon oxynitride, in a conventional manner by depositing a conformal blanket layer and isotropically etching. The use of such intermediate dielectric sidewall spacers avoids reforming a dielectric sidewall spacer prior to contact formation, e.g., silicide contact formation. Thus, by employing intermediate, relatively thin dielectric sidewall spacers, the gate electrode structure is isolated from subsequent silicidation and/or metallization processing for contact formation.

The present invention is applicable to the manufacture of various types of semiconductor devices. The present invention has particular industrial applicability in the manufacture of high density semiconductor devices having a design rule of about 0.18 micron and under.

In the previous descriptions, numerous specific details are set forth, such as specific materials, structure, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising:

forming a gate electrode, having first and second side surfaces, over a substrate;

depositing a layer of positive photoresist material on the feature covering the first and second side surfaces;

irradiating the photoresist layer at an angle with respect to the substrate such that a portion of the photoresist material on the first side surface is shadowed from irradiation by the gate electrode, thereby preventing irradiation exposure of the portion of photoresist material on the first side surface; and removing the irradiated positive photoresist material with a developer leaving the non-irradiated portion of photoresist material on the first side surface as a sidewall spacer.

2. The method according to claim 1, wherein the angle is greater than 0° and less than 90° with respect to the substrate.

3. A method of manufacturing a semiconductor device, the method comprising:

forming a gate electrode having first and second side surfaces, on a substrate with a gate dielectric layer therebetween;

depositing a layer of positive photoresist material on the gate electrode covering the first and second side surfaces;

irradiating the photoresist layer at a first dosage, less than that sufficient to render unexposed photoresist material soluble in a developer, and at a first angle greater than 0° and less than 90° with respect to the substrate such that a portion of the photoresist material on the first side surface is shadowed from irradiation by the gate electrode thereby preventing irradiation exposure of the portion of photoresist material on the first side surface to the first dosage;

irradiating the photoresist at a second dosage, less than that sufficient to render unexposed photoresist material soluble in the developer, and at a second angle greater than 0° and less than 90° with respect to the substrate such that a portion of the photoresist layer on the second side surface is shadowed from irradiation by the gate electrode, thereby preventing irradiation exposure of the photoresist portion on the second side surface to the second dosage, wherein portions of the photoresist layer exposed to the first and second dosages are rendered soluble in the developer; and removing the soluble portions of the photoresist layer with the developer, leaving photoresist sidewall spacers on the first and second side surfaces of the gate electrode.

4. The method according to claim 3, wherein:

the first angle is greater than 0° and less than 90°; and the second angle is greater than 90° and less than 180°.

5. The method according to claim 3, wherein:

the first dosage is about 50% of that necessary to render unexposed photoresist material soluble in the developer; and the second dosage is about 50% of that necessary to render unexposed photoresist material soluble in the developer.

6. The method according to claim 3, wherein the photoresist sidewall spacers are substantially triangular in shape.

7. The method according to claim 3, further comprising forming a dielectric sidewall spacer on each side surface before depositing the layer of photoresist material.

8. The method according to claim 7, wherein the dielectric sidewall spacer comprises an oxide, a nitride or an oxynitride.

9. A method of manufacturing a CMOS transistor device, the method comprising the sequential steps:

(a) forming first and second gate electrode structures, each comprising an underlying gate dielectric layer and having first and second side surfaces, on electrically isolated first and second opposite conductivity type regions, respectfully, of a substrate;

(b) forming photoresist sidewall spacers on the first and second side surfaces of each gate electrode structure;

(c) forming a first photoresist mask on the second region over the second gate electrode structure and photoresist sidewall spacers thereon;

(d) ion implanting impurities of the first conductivity type, using the first gate electrode structure and photoresist sidewall spacers thereon as a mask, to form first moderately or heavily doped source/drain implants;

(e) removing the first photoresist mask and photoresist sidewall spacers from the first and second side surfaces of the first gate electrode structure;

(f) forming photoresist sidewall spacers on the first and second side surfaces of each gate electrode structure;

(g) forming a second photoresist mask on the first region over the first gate electrode structure;

(h) ion implanting impurities of a second conductivity type opposite the first conductivity type, using the second gate electrode structure and photoresist sidewall spacers thereon as a mask, to form second moderately or heavily doped source/drain implants;

(i) removing the second photoresist mask and photoresist sidewall spacers from the each and second side surfaces of the first gate electrode structure;

(j) activation annealing to form first and second moderately or heavily doped source/drain regions;

(k) forming a third photoresist mask on the second region over the second gate electrode structure;

(l) ion implanting impurities of the first conductivity type, using the first gate electrode structure as a mask, to implant shallow source/drain extensions;

(m) ion implementing impurities of the second conductivity type into the first region to form a first halo implant;

(n) removing the third photoresist mask;

(o) forming a fourth photoresist mask on the first region over the first gate electrode structure;

(p) ion implanting impurities of the second conductivity type using the second gate electrode structure as a mask to implant second shallow source/drain extensions;

(q) ion implanting impurities of the first conductivity type in the second region to form a second halo implant;

(r) removing the fourth photoresist mask; and (s) annealing to form first and second shallow source/drain extension regions and first and second halo regions.

10. The method according to claim 9, comprising forming the photoresist sidewall spacers by:

forming photoresist sidewall spacers on the first and second side surfaces of each gate electrode structure;

irradiating the layer of photoresist material at a first dosage, less than that sufficient to render unexposed photoresist material soluble in a developer, and at a first angle with respect to the substrate such that a portion of the photoresist material on the first side surface of each gate electrode structure is shadowed from irradiation by the respective gate electrode structure, thereby preventing irradiation exposure of the portion of photoresist material on the first side surfaces to the first dosage;

irradiating the layer of photoresist material at a second dosage, less than that sufficient to render unexposed photoresist material soluble in the developer, and at a second angle with respect to the substrate such that a portion of the photoresist material on the second side surface of each gate electrode structure is shadowed from irradiation by the respective gate electrode structure, thereby preventing irradiation exposure of the portion of photoresist material on the second side surfaces to the second dosage, wherein the portions of the photoresist material exposed to the first and second dosages are rendered soluble in the developer; and removing the soluble portions of photoresist material with the developer leaving photoresist sidewall spacers on the first and second side surfaces of each gate electrode structure.

11. The method according to claim 10, wherein;

the first angle is greater than 0° and less than 90°; and the second angle is greater than 90° and less than 180°.

12. The method according to claim 10, wherein;

the first dosage is about 50% of that necessary to render unexposed photoresist material soluble in the developer; and the second dosage is about 50% of that necessary to render unexposed - photoresist material soluble in the developer.

13. The method according to claim 10, wherein the photoresist sidewall spacers are substantially triangular in shape.

14. The method according to claim 10, further comprising forming a dielectric sidewall spacer on each side surface of the gate electrode structures before depositing the layer of photoresist material.

15. The method according to claim 14, wherein the dielectric sidewall spacers comprise an oxide, a nitride or an oxynitride.

16. The method according to claim 15, wherein each dielectric sidewall spacer extends a shorter distance on the substrate than the photoresist sidewall spacer from the gate electrode.

* * * * *